(12) United States Patent
Seol et al.

(10) Patent No.: US 8,053,302 B2
(45) Date of Patent: Nov. 8, 2011

(54) NON-VOLATILE MEMORY DEVICE AND METHOD OF MANUFACTURING SAME

(75) Inventors: Kwang-soo Seol, Yongin-si (KR); Yoon-dong Park, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 136 days.

(21) Appl. No.: 12/461,416

(22) Filed: Aug. 11, 2009

(65) Prior Publication Data
US 2010/0044778 A1 Feb. 25, 2010

(30) Foreign Application Priority Data
Aug. 21, 2008 (KR) .................. 10-2008-0081857

(51) Int. Cl.
*H01L 21/8239* (2006.01)
(52) U.S. Cl. .............. 438/201; 257/320; 257/E21.209; 257/E21.21
(58) Field of Classification Search .............. 438/201; 257/E21.209, E21.21
See application file for complete search history.

(56) References Cited

U.S. PATENT DOCUMENTS

| 2007/0020853 A1* | 1/2007 | Gao et al. ............ 438/266 |
| 2007/0158736 A1* | 7/2007 | Arai et al. ............ 257/315 |
| 2008/0073635 A1 | 3/2008 | Kiyotoshi et al. |
| 2009/0001419 A1 | 1/2009 | Han et al. |

FOREIGN PATENT DOCUMENTS

| JP | 2008-078404 A | 4/2008 |
| KR | 10-0855990 B1 | 8/2008 |
| KR | 10-2008-0096734 A | 11/2008 |

* cited by examiner

*Primary Examiner* — Jerome Jackson, Jr.
*Assistant Examiner* — Paul Budd
(74) *Attorney, Agent, or Firm* — Lee & Morse, P.C.

(57) ABSTRACT

A non-volatile memory device and a method of manufacturing the non-volatile memory device are provided. At least one first semiconductor layer and at least one second semiconductor layer are disposed. At least one control gate electrode is disposed between the at least one first semiconductor layer and the at least one second semiconductor layer. At least one first layer selection line is capacitively coupled to the at least one first semiconductor layer. At least one second layer selection line is capacitively coupled to the at least one second semiconductor layer.

14 Claims, 12 Drawing Sheets

NON-VOLATILE MEMORY DEVICE AND METHOD OF MANUFACTURING SAME

BACKGROUND

1. Field

One or more embodiments relate to a semiconductor device and, more particularly, to a non-volatile memory device and a method of manufacturing the non-volatile memory device.

2. Description of the Related Art

There are demands for semiconductor products to be not only smaller but also to have larger capacity to process data. Therefore, it is necessary to increase integration of non-volatile memory devices used in such semiconductor products. In this regard, since non-volatile memory devices having a multi-layer structure can stack a plurality of memory cells vertically, they are more highly integrated than conventional non-volatile devices having a single layer structure.

However, non-volatile memory devices having a multi-layer structure do not easily perform a selective operation with respect to a memory cell of each layer. Furthermore, a method of manufacturing non-volatile memory devices having a multi-layer structure is complicated.

SUMMARY

Embodiments are directed to a non-volatile memory device and method of manufacturing the same.

According to some embodiments of the present invention, there is provided a non-volatile memory device including at least one first semiconductor layer, at least one second semiconductor layer, at least one control gate electrode between the at least one first semiconductor layer and the at least one second semiconductor layer, at least one first layer selection line capacitively coupled to the at least one first semiconductor layer, and at least one second layer selection line capacitively coupled to the at least one second semiconductor layer.

At least one first layer selection line may be capacitively coupled to a sidewall of the at least one first semiconductor layer opposite to the at least one control gate electrode, and the at least one second layer selection line may be capacitively coupled to a sidewall of the at least one second semiconductor layer opposite to the at least one control gate electrode.

At least one first charge storage layer may be between the at least one first semiconductor layer and the at least one control gate electrode, and at least one second charge storage layer may be between the at least one second semiconductor layer and the at least one control gate electrode.

In the non-volatile memory device, at least one first tunneling storage layer may be between the at least one first semiconductor layer and the at least one first charge storage layer, and at least one second tunneling storage layer may be between the at least one second semiconductor layer and the at least one second charge storage layer. At least one first blocking insulation layer may be between the at least one first charge storage layer and the at least one control gate electrode, and at least one second blocking insulation layer may be between the at least one second charge storage layer and the at least one control gate electrode.

A plurality of the control gate electrodes may be between the at least one first semiconductor layer and the at least one second semiconductor layer.

The non-volatile memory device may include a plurality of the first semiconductor layers and a plurality of second semiconductor layer, the first semiconductor layers may be stacked on each other and the second semiconductor layer may be stacked on each other.

A plurality of first interlayer insulation layers may alternatively be placed between the plurality of first semiconductor layers stacked on each other, and a plurality of second interlayer insulation layer may alternatively be placed between the plurality of second semiconductor layers stacked on each other.

The non-volatile memory device may include a plurality of first layer selection lines and a plurality of the second layer selection lines, each of the first layer selection lines may be capacitively coupled to a respective one of the plurality of the first semiconductor layers, and each of the second layer selection lines may be capacitively coupled to a respective one of the plurality of second semiconductor layers.

At least one first dielectric layer may be between the at least one first semiconductor layer and the at least one first layer selection line, and at least one second dielectric layer may be between the at least one second semiconductor layer and the at least one second layer selection line.

According to some embodiments of the present invention, there is provided a method of manufacturing a non-volatile memory device including forming at least one first semiconductor layer in a stack, forming at least one second semiconductor layer in a stack, forming at least one first layer selection line capacitively coupled to the at least one first semiconductor layer, forming at least one second layer selection line capacitively coupled to the at least one second semiconductor layer, and forming at least one control gate electrode between the at least one first semiconductor layer and the at least one second semiconductor layer.

The forming of the at least one first semiconductor layer and the at least one second semiconductor layer may include forming a plurality of interlayer insulation layers on a substrate, forming an epitaxial layer to cover the plurality of interlayer insulation layers, repeating the formation of the plurality of interlayer insulation layers and the epitaxial layer for at least one more time, and patterning the epitaxial layer.

The epitaxial layer may be formed using an epitaxial lateral overgrowth (ELO) method.

The patterning of the epitaxial layer may include removing a plurality of connection parts formed between the plurality of interlayer insulation layers.

The method of manufacturing a non-volatile memory device may further include recessing sidewalls of one side of the at least one first semiconductor layer and the at least one second semiconductor layer before forming the at least one first layer selection line and the at least one second layer selection line, wherein the at least one first layer selection line may be formed on the recessed sidewalls of the at least one first semiconductor layer and wherein the at least one second layer selection line may be formed on the recessed sidewalls of the at least one second semiconductor layer.

The method of manufacturing a non-volatile memory device may further include forming at least one first dielectric layer on the recessed sidewalls of the at least one first semiconductor layer, and forming at least one second dielectric layer on the recessed sidewalls of the at least one second semiconductor layer before forming the at least one first layer selection line and the at least one second layer selection line.

At least one control gate electrode may be formed between sidewalls of the at least one first semiconductor layer opposite to the at least one first layer selection line and sidewalls of the at least one second semiconductor layer opposite to the at least one second layer selection line.

At least one control gate electrode may be formed after the at least one first layer selection line and the at least one second layer selection line are formed.

At least one first layer selection line and the at least one second layer selection line may be formed after the at least one control gate electrode is formed.

The method of manufacturing a non-volatile memory device may include forming at least one first charge storage layer between the at least one first semiconductor layer and the at least one control gate electrode, and forming at least one second charge storage layer between the at least one second semiconductor layer and the at least one control gate electrode.

The method of manufacturing a non-volatile memory device may include forming at least one first tunneling storage layer between the at least one first semiconductor layer and the at least one first charge storage layer, forming at least one second tunneling storage layer between the at least one second semiconductor layer and the at least one second charge storage layer, forming at least one first blocking insulation layer between the at least one first charge storage layer and the at least one control gate electrode, and forming at least one second blocking insulation layer between the at least one second charge storage layer and the at least one control gate electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF EMBODIMENTS

Figure 1:
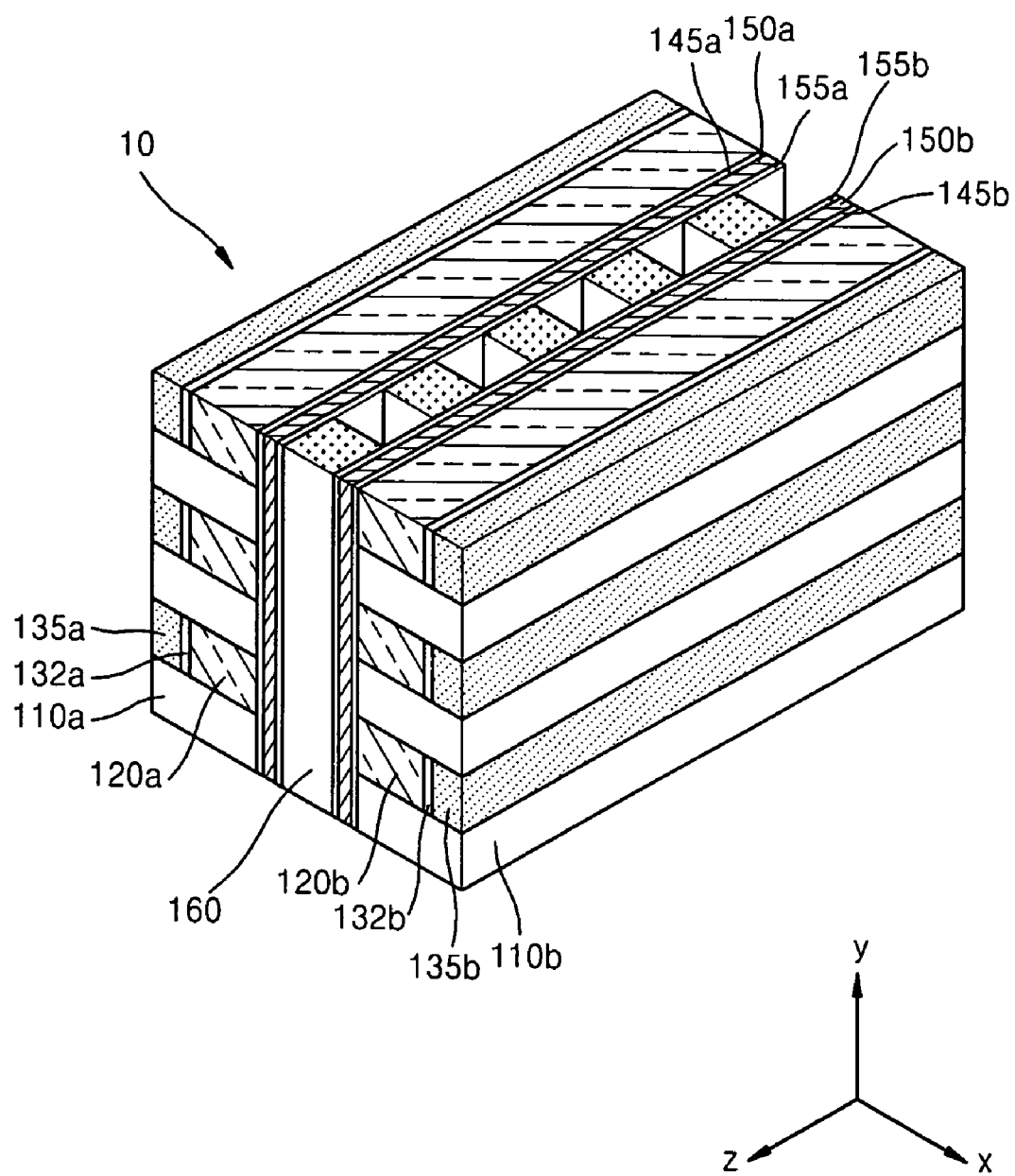
FIG. 1 illustrates a perspective view of a non-volatile memory device according to an embodiment.

Korean Patent Application No. 10-2008-0081857, filed on Aug. 21, 2008, in the Korean Intellectual Property Office, and entitled: "Non-Volatile Memory Device and Method of Manufacturing Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a perspective view of a non-volatile memory device 10 according to an embodiment.

Referring to FIG. 1, the non-volatile memory device 10 may include one or more first semiconductor layers 120a and one or more second semiconductor layers 120b. The one or more first semiconductor layers 120a and the one or more second semiconductor layer 120b may be respectively stacked. As shown in FIG. 1, each of the first semiconductor layers 120a may be stacked so as to face at least a portion of a corresponding one of the second semiconductor layers 120b. The second semiconductor layers 120b may be stacked close to one or more first semiconductor layers 120a. A number of the stacked first semiconductor layer 120a may be same as a number of the stacked second semiconductor layer 120b. The number of the first semiconductor layers 120a and the second semiconductor layers 120b may properly be selected according to the storage capacity of the non-volatile memory device 10, and may not be limited to the present embodiment.

For example, the first semiconductor layers 120a and the second semiconductor layers 120b may have a single crystalline structure, e.g., epitaxial layers grown on a single crystal substrate. For another example, the first semiconductor layers 120a and the second semiconductor layers 120b may have a polycrystalline structure. The first semiconductor layers 120a and the second semiconductor layers 120b may be formed of a suitable semiconductor material, e.g. silicon, germanium, or silicon germanium. However, embodiments are not limited thereto. The first semiconductor layers 120a and the second semiconductor layers 120b may be formed of the same semiconductor material or of a different semiconductor material.

The first semiconductor layers 120a may be stacked by alternately interposing a plurality of interlayer insulating layers 110a therebetween, and the second semiconductor layers 120b may be stacked by alternately interposing a plurality of interlayer insulating layers 110b therebetween. A number of the interlayer insulating layers 110a alternatively interposed between the first semiconductor layers 120a may be same as a number of the interlayer insulating layers 110b alternatively interposed between the second semiconductor layers 120b. The interlayer insulating layers 110a and 110b may be formed of a suitable insulating material.

One or more control gate electrodes 160 may be provided between the first semiconductor layers 120a and the second semiconductor layers 120b. The control gate electrodes 160 may extend across sidewalls of the first semiconductor layers 120a and the second semiconductor layers 120b, e.g., along the y-axis. The control gate electrodes 160 may be spaced apart from adjacent control gate electrodes 160 in a direction in which the first semiconductor layers 120a and the second semiconductor layers 120b extend, e.g., along the z-axis. The control gate electrodes 160 may be spaced apart from adjacent control gate electrodes 160 by a predetermined distance. The number of the control gate electrodes 160 may be properly selected according to the storage capacity of the non-volatile memory device, and is not limited to the present embodiment as illustrated in FIG. 1.

One or more first charge storage layers 150a may be provided between the first semiconductor layers 120a and the control gate electrodes 160. Each of the first charge storage layers 150a may overlap and/or be associated with one, some, or all of the stacked first semiconductor layers 120a and/or may overlap and/or be associated with one, some, or all of the control gate electrodes 160. One or more second charge storage layers 150b may be provided between the second semiconductor layers 120b and the control gate electrodes 160. Each of the second charge storage layers 150b may overlap and/or be associated with one, some, or all of the stacked second semiconductor layers 120b and/or may overlap and/or be associated with one, some, or all of the control gate electrodes 160. Each of the first charge storage layers 150a and the second charge storage layers 150b may be a continuous single layer associated with a plurality of the control gate electrodes 160, e.g., and not segmented as the control gate electrodes 160.

The first charge storage layers 150a and the second charge storage layers 150b may be used as a charge storage medium for storing data. For example, charges may be stored in the first charge storage layers 150a and the second charge storage layers 150b. When data is programmed, the charges may be removed, and then data may be erased.

Therefore, the first charge storage layers 150a and the second charge storage layers 150b may be formed of a material having charge storage capability. For example, the first charge storage layers 150a and the second charge storage layers 150b may include charge trap materials, e.g., silicon-nitride layers, quantum dots, nano-crystals, etc. The quantum dots or the nano-crystals may be formed of fine particles of a conductor, e.g., a metal or a semiconductor. In this case, the non-volatile memory device may perform a multi-bit operation by using local charge storage characteristics of the first charge storage layers 150a and the second charge storage layers 150b.

One or more first tunneling insulation layers 145a may be provided between the first semiconductor layers 120a and the first charge storage layers 150a. One or more second tunneling insulation layers 145b may be provided between the second semiconductor layers 120b and the second charge storage layers 150b. One or more first blocking insulation layers 155a may be provided between the first charge storage layers 150a and the control gate electrodes 160. One or more second blocking insulation layers 155b may be provided between the second charge storage layers 150b and the control gate electrodes 160. The first tunneling insulation layers 145a, the second tunneling insulation layers 145b, the first blocking insulation layers 155a and the second blocking insulation layers 155b may each be formed of one continuous layer associated with a plurality of the control electrodes 160, e.g., not segmented to correspond to each of the control gate electrodes 160.

The first and second tunneling insulation layers 145a and 145b and the first and second blocking insulation layers 155a and 155b may be formed of suitable insulation materials, e.g., oxides, nitrides, high-k dielectric materials, structures in which two or more of the insulation materials are stacked, etc. More particularly, e.g., the high-k dielectric materials may include dielectric materials having a higher dielectric constant than oxides and nitrides.

The non-volatile memory device 10 may include one or more first layer selection lines 135a and one or more second layer selection lines 135b. Each of the first layer selection lines 135a may be capacitively coupled to a respective one of the first semiconductor layers 120a. Each of the one or more second layer selection lines 135b may be capacitively coupled to a respective one of the second semiconductor layers 120b. For example, the first layer selection lines 135a may be respectively disposed on sidewalls of the first semiconductor layers 120a. The first layer selection lines 135a may extend along the z-axis along a side of the respective first semiconductor layers 120a, opposite of the control gate electrodes 160. Each of the second layer selection lines 135b may be, respectively, disposed on sidewalls of the second semiconductor layers 120b. The second layer selection lines 135b may extend along the z-axis along a side of the respective second semiconductor layer 120b, opposite of the control gate electrodes 160. The first layer selection lines 135a and the second layer selection lines 135b may be stacked adjacent to the first semiconductor layers 120a and the second semiconductor layers 120b, respectively, with the interlayer insulating layers 110a and 110b alternatively interposed therebetween.

One or more first dielectric layers 132a may be provided between the first semiconductor layers 120a and the first layer selection lines 135a. One or more second dielectric layers 132b may be provided between the second semiconductor layers 120b and the second layer selection lines 135b. Each of the first layer selection lines 135a may be used to capacitively control an electric potential of the respective first semiconductor layer 120a. Each of the second layer selection lines 135b may be used to capacitively control an electric potential of the respective second semiconductor layer 120b.

Employing features of the exemplary non-volatile memory device 10 of FIG. 1, a plurality of memory cells (not shown) may be provided in a multi-layer NAND structure. Therefore, embodiments may enable the integration density of non-volatile memory devices to be increased by increasing the number of stacked layers of the first semiconductor layers 120a and the second semiconductor layers 120b.

Figure 2:
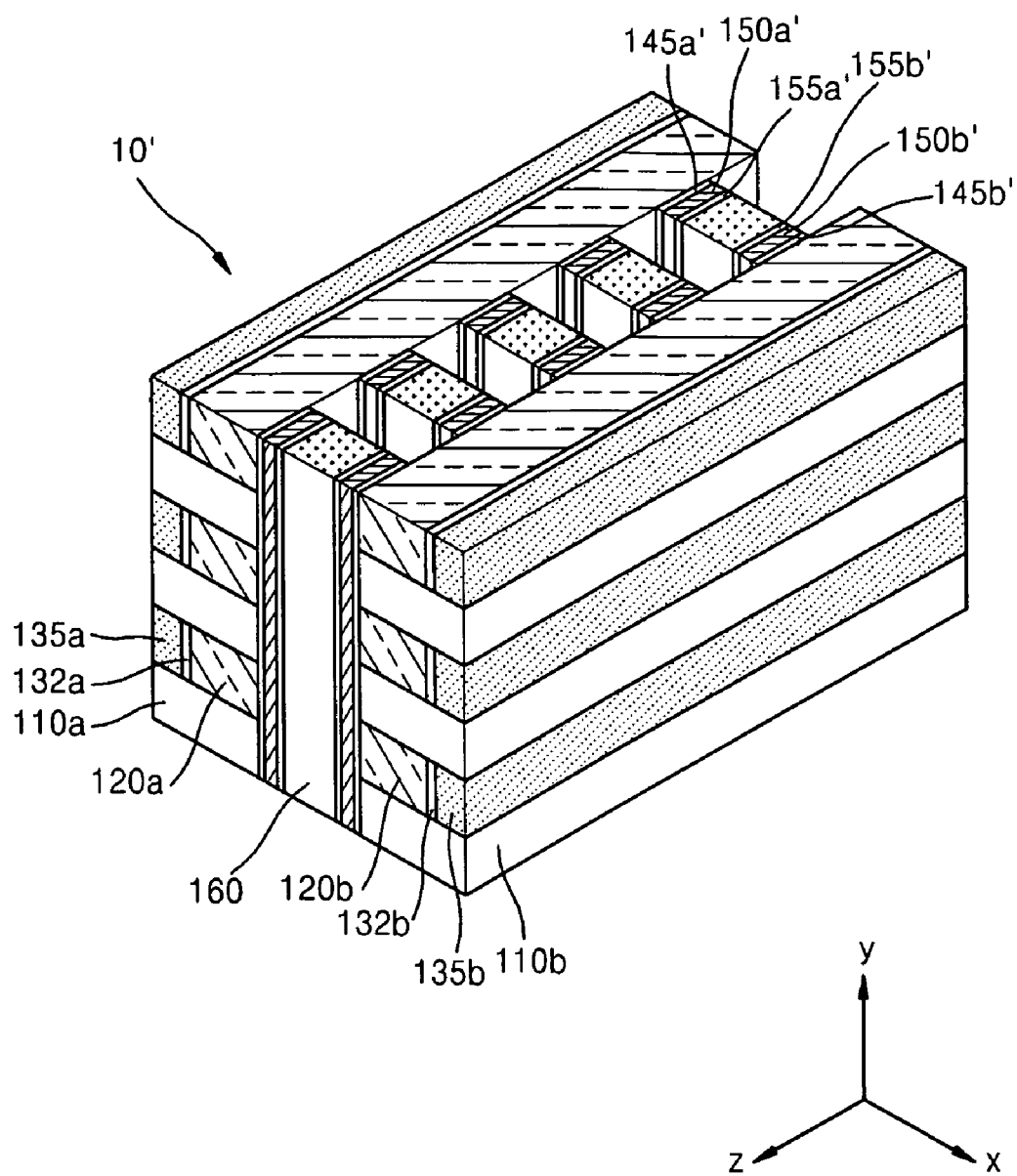
FIG. 2 illustrates a perspective view of a non-volatile memory device according to another embodiment.

FIG. 2 illustrates a perspective view of a non-volatile memory device 10' according to another embodiment. The non-volatile memory device 10' of the present embodiment is a modification of the non-volatile memory device 10 illustrated in FIG. 1, and thus, the redundant description thereof will not be repeated here.

Referring to FIG. 2, a plurality of first tunneling insulation layers 145a', a plurality of first charge storage layers 150a', and a plurality of first blocking insulation layers 155a' may be interposed between the first semiconductor layers 120a and the control gate electrodes 160. More particularly, each of the first tunneling insulation layers 145a', the first charge storage layers 150a', and the first blocking insulation layers 155a' may overlap with and/or be associated with only one of the control gate electrodes 160. The first tunneling insulation layers 145a', the first charge storage layers 150a', and the first blocking insulation layers 155a' may extend across the sidewalls of the first semiconductor layers 120a and the control gate electrodes 160 along the y-axis and may be aligned with respective sidewalls of the control gate electrodes 160. For example, each of the first tunneling insulation layers 145a', the first charge storage layers 150a', and the first blocking insulation layers 155a' may have a cross-sectional shape along the y-z plane directly corresponding to a corresponding one of the control gate electrode 160. Therefore, the first tunneling insulation layers 145a', the first charge storage layers 150a' and the first blocking insulation layers 155a' may not be present in spaces between two adjacent ones of the control gate electrodes 160.

A plurality of second tunneling insulation layers 145b', a plurality of second charge storage layers 150b', and a plurality of second blocking insulation layers 155b' may be interposed between the second semiconductor layers 120b and the control gate electrodes 160. More particularly, each of the second tunneling insulation layers 145b', the second charge storage layers 150b', and the second blocking insulation layers 155b' may overlap with and/or be associated with only one of the control gate electrodes 160. The second tunneling insulation layers 145b', the second charge storage layers 150b', and the second blocking insulation layers 155b' may extend across the sidewalls of the second semiconductor layers 120b and the control gate electrodes 160, e.g., along the y-axis, and may be aligned with respective sidewalls of the control gate electrodes 160. For example, each of the second tunneling insulation layers 145b', the second charge storage layers 150b', and the second blocking insulation layers 155b' may have a cross-sectional shape along the y-z plane directly corresponding to a corresponding one of control gate electrodes 160. Therefore, the second tunneling insulation layers 145b', the second charge storage layers 150b' and the second blocking insulation layers 155b' may not be present in spaces between two adjacent ones of the control gate electrodes 160.

Figure 3:
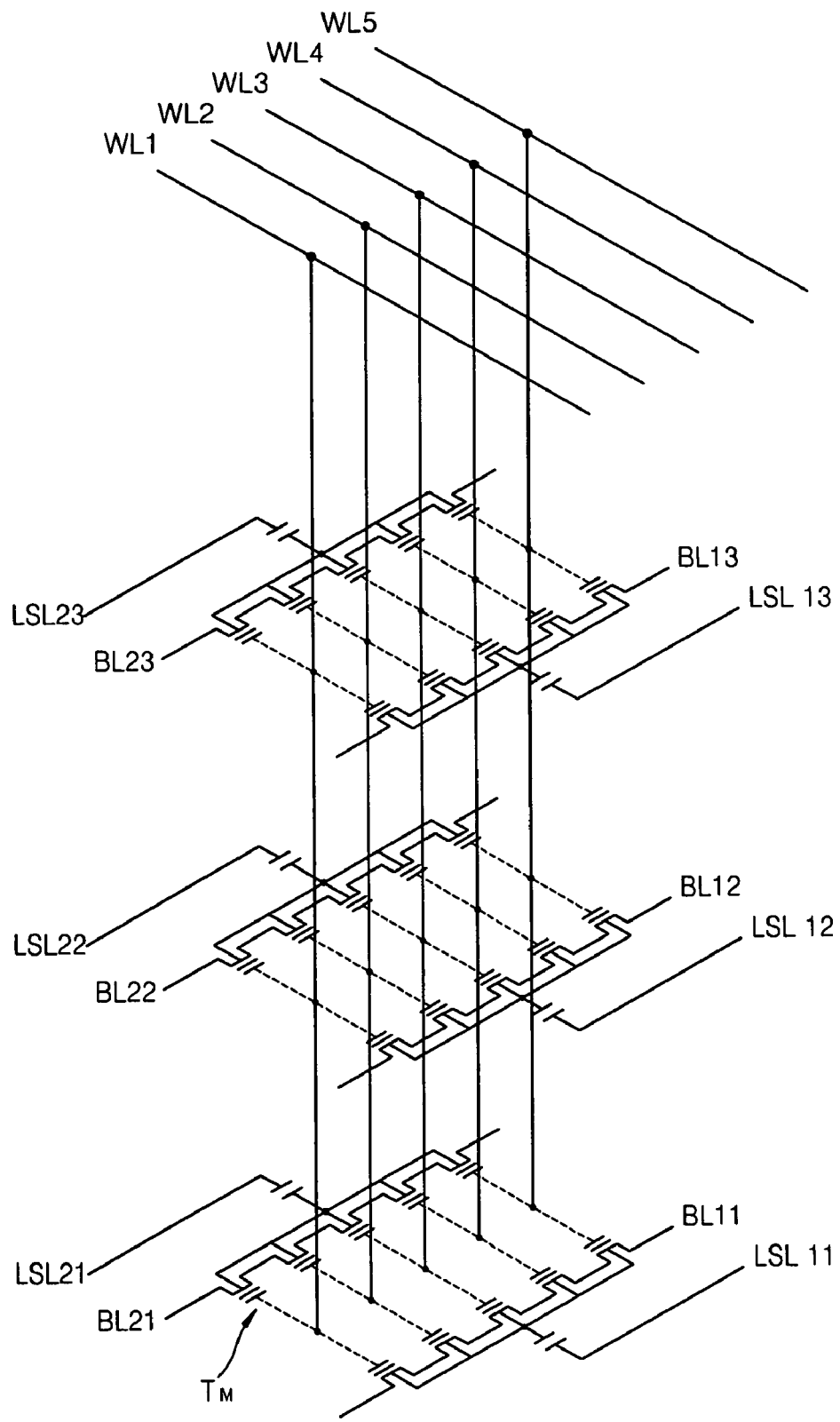
FIG. 3 illustrates a circuit diagram of a non-volatile memory device according to an embodiment.

FIG. 3 illustrates a circuit diagram of a non-volatile memory device according to an embodiment.

Referring to FIG. 3, bitlines BL11 and BL21 and layer selection lines LSL11 and LSL21 may be connected in two rows to memory cells $T_M$ disposed on a first layer. Bitlines BL12 and BL22 and layer selection lines LSL12 and LSL22 may be connected in two rows to the memory cells $T_M$ disposed on a second layer. Bitlines BL13 and BL23 and layer selection lines LSL13 and LSL23 may be connected in two rows to the memory cells $T_M$ disposed on a third layer. The number of layers in the memory cells $T_M$ may be selected according to the storage capacity of the non-volatile memory device.

Wordlines WL1 through WL5 may be disposed such that the memory cells of each of the layers $T_M$ disposed along the same column may be commonly connected to one of the wordlines WL1 through WL5. Five wordlines of WL1 through WL5 and the five memory cells $T_M$ are illustrated in FIG. 3, but the embodiments are not limited thereto.

A method of operating the non-volatile memory device will now be described. Table 1 shows operating conditions of the non-volatile memory device according to the present embodiment.

TABLE 1

| | Program | Read | Erase |
|---|---|---|---|
| SEL_LSL | 0 V | 0 V | F/T |
| USL_LSL | $V_{PI}$ | $V_{RI}$ | F/T |
| SEL_WL | $V_{pgm}$ | $V_{ref}$ | 0 V |
| USL_WL | $V_{pass}$ | $V_{pass}$ | 0 V |
| SEL_BL | 0 V | $V_{read}$ | F/T |
| USL_BL | $V_{cc}$ | 0 V | F/T |
| Body | 0 V | 0 V | $V_{ers}$ |

In Table 1, a selected layer selection line SEL_LSL may refer to at least one selected from the layer selection lines LSL11, LSL21, LSL12, LSL22, LSL13, and LSL23, whereas unselected layer selection lines USL_LSL may refer to the residual layer selection lines from the layer selection lines excluding the selected layer selection line SEL_LSL. A selected wordline SEL_WL may refer to at least one selected from the wordlines WL1 through WL5, whereas unselected wordlines USL_WL may refer to the residual wordlines excluding the selected wordline SEL_WL. A selected bitline SEL_BL may refer to at least one selected from the bitlines BL11, BL21, BL12, BL22, BL13, and BL23, whereas unselected bitlines USL_BL may refer to the residual bitlines excluding the selected bitline SEL_BL. A body Body may refer to bodies of the memory cells $T_M$.

A programming operation may be performed by applying a programming voltage $V_{pgm}$ to the selected wordline SEL_WL and applying a passing voltage $V_{pass}$ to the unselected wordlines USL_WL. In this case, 0 V may be applied to the selected bitline SEL_BL, an operating voltage $V_{cc}$ may be applied to the unselected bitlines USL_BL, and 0 V may be applied to the body Body. 0 V may be applied to the selected layer selection line SEL_LSL, and a programming inhibiting voltage $V_{PI}$ may be applied to the unselected layer selection lines USL_LSL.

In this case, charges may be injected into the memory cells $T_M$ coupled to the selected wordline SEL_WL, the selected bitlines SEL_BL, and the selected layer selection line SEL_LSL. However, electrons may be exhausted, and thus, charges may not be input into the unselected wordline USL_WL, the unselected bitlines USL_BL, or the unselected layer selection lines USL_LSL.

For example, the programming inhibiting voltage $V_{PI}$ may be selected as a positive voltage greater than 0 V. In this regard, the channel electric potential of the memory cells $T_M$ coupled to the unselected layer selection lines USL_LSL may be a positive value. The application of the positive programming inhibiting voltage $V_{PI}$ may be similar to the application of a channel boosting voltage to the unselected bitlines USL_BL. For another example, the programming inhibiting voltage $V_{PI}$ may be selected as a negative voltage less than 0 V. In this regard, the channel electric potential of the memory cells $T_M$ coupled to the unselected layer selection lines USL_LSL may be a negative value. The application of the negative programming inhibiting voltage $V_{PI}$ may be similar to the application of a negative bias voltage to the channel of the memory cells $T_M$ coupled to the unselected layer selection lines USL_LSL.

A reading operation may be performed by applying a reference voltage $V_{ref}$ to the selected wordline SEL_WL and applying the passing voltage $V_{pass}$ to the unselected wordlines USL_WL. In this case, a reading voltage $V_{read}$ may be applied to the selected bitline SEL_BL, 0 V may be applied to the unselected bitlines USL_BL, and a reading inhibiting voltage $V_{RI}$ may be applied to the unselected layer selection lines USL_LSL, while 0 V may be applied to the selected layer selection lines SEL_LSL.

For example, the reading inhibiting voltage $V_{RI}$ may be selected as a negative voltage less than 0 V. The negative reading inhibiting voltage $V_{RI}$ may perform the same function as the program inhibiting voltage $V_{PI}$.

An erasing operation may be performed by applying 0 V to the selected wordline SEL_WL and the unselected wordlines USL_WL and applying an erasing voltage $V_{ers}$ to the body Body. In this case, the selected layer selection line SEL_LSL, the unselected layer selection lines USL_LSL, the selected bitline SEL_BL, and the unselected bitlines USL_BL may be floated (indicated as F/T in Table 1).

FIGS. 4 through 13 illustrate perspective views of stages in a method of manufacturing a non-volatile memory device according to an embodiment.

Figure 4:
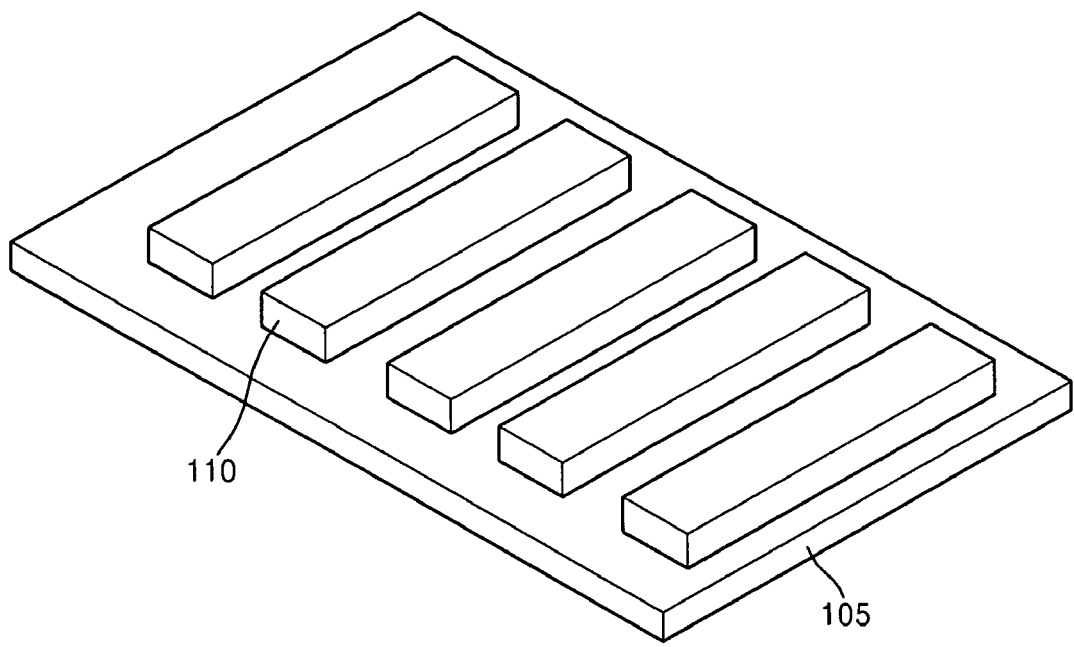
FIGS. 4 through 13 illustrate perspective views of stages in a method of manufacturing a non-volatile memory device according to an embodiment.

Referring to FIG. 4, interlayer insulation layers 110 may be patterned on a semiconductor layer 105. For example, the interlayer insulation layers 110 may be formed by forming a suitable insulation layer (not shown) on the semiconductor layer 105 and patterning the insulation layer using a photolithography and an etching technique. The semiconductor layer 105 may be a semiconductor having a single crystalline structure.

Figure 5:
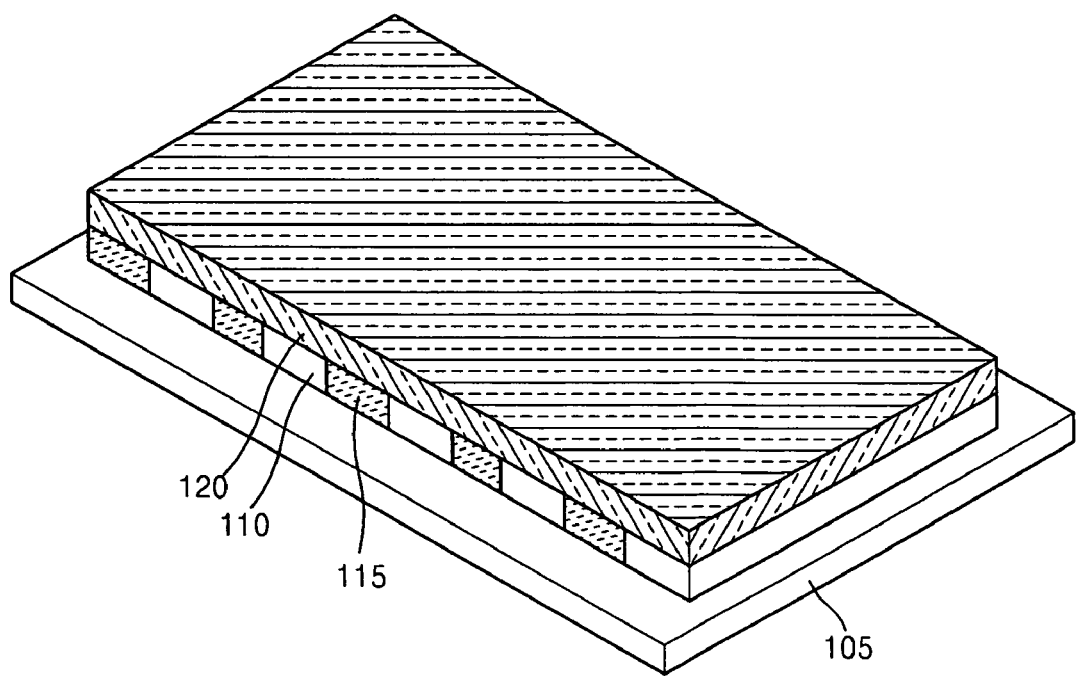

Referring to FIG. 5, an epitaxial layer 120 may be formed on the semiconductor layer 105 to bury the interlayer insulation layers 110. The epitaxial layer 120 may include one or more connection parts 115 formed on the semiconductor layer 105 between the interlayer insulation layers 110. The epitaxial layer 120, excluding the connection parts 115, may be on the interlayer insulation layers 110. The epitaxial layer 120 may be formed of the same material as the semiconductor layer 105 or a material having a very similar lattice constant as a material forming the semiconductor layer 105. For example, silicon and silicon-germanium have lattice constants very similar to each other, and thus, one of them may grow as an epitaxial layer from the other.

For example, the epitaxial layer 120 may be formed using an epitaxial lateral overgrowth (ELO) method. The epitaxial layer 120 may be formed by being grown upward from the connection part 115 and sideward onto the interlayer insulation layers 110 after the connection part 115 is grown from the semiconductor layer 105. Therefore, the thickness of the epitaxial layer 120 may be adjusted to bury the interlayer insulation layers 110. The epitaxial layer 120 may have a structure that matches a lattice of the semiconductor layer 105, and thus, the epitaxial layer 120 may have a single crystalline structure.

In another implementation of the present embodiment, the epitaxial layer 120 may be replaced with a semiconductor layer having a polycrystalline structure.

Figure 6:
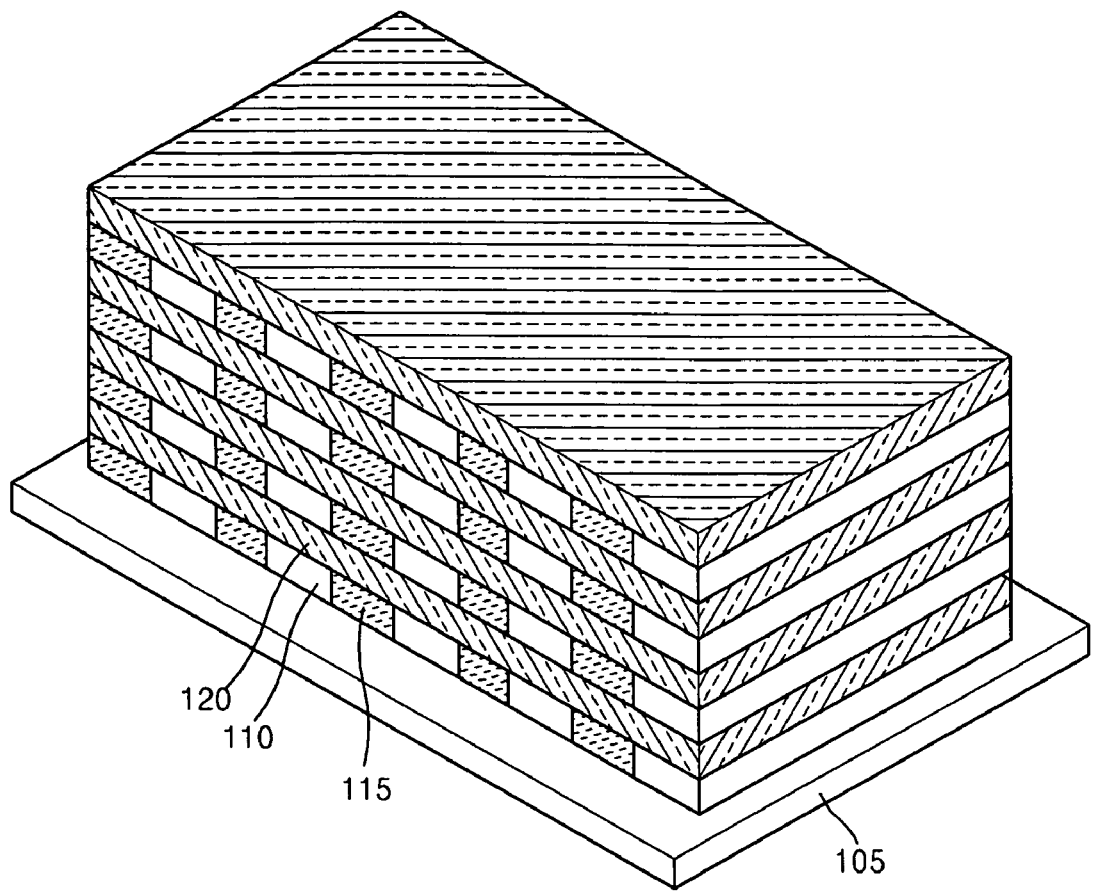

Referring to FIG. 6, the operations illustrated in FIGS. 4 and 5 may be repeated more than once to form the stacked structure of the epitaxial layer 120 and interlayer insulation layers 110. The number of the operations being repeated may be used to adjust the stacked number of the epitaxial layer 120.

Figure 7:
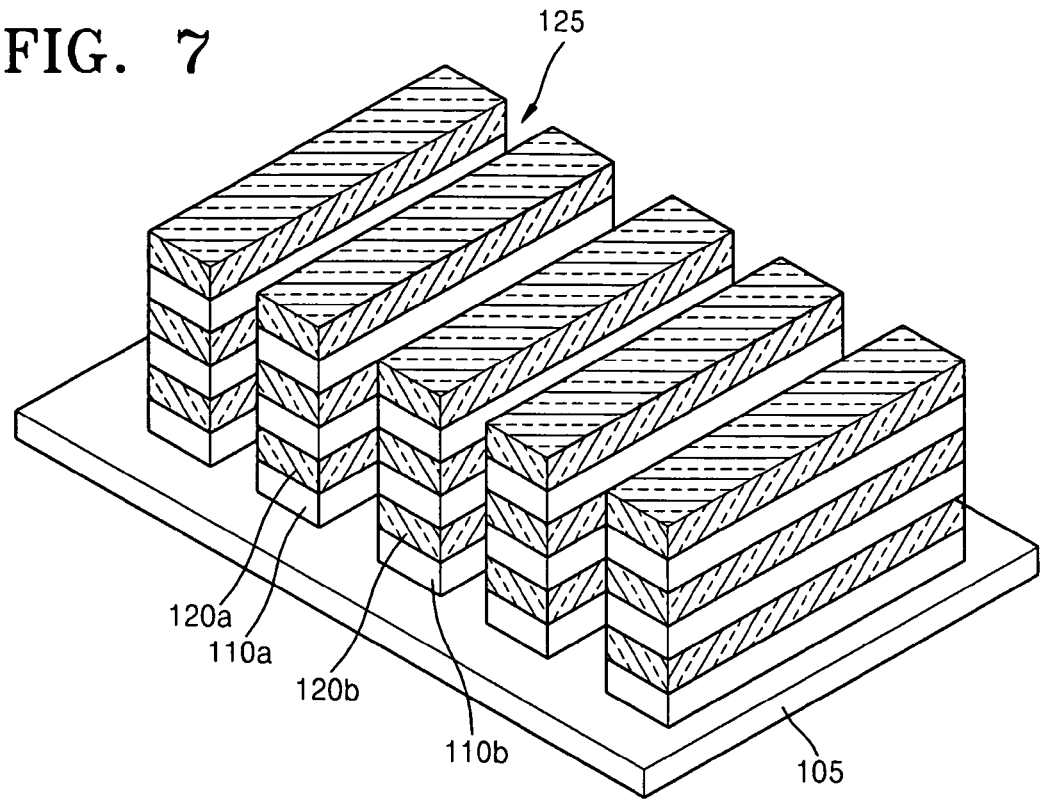

Referring to FIG. 7, the first and second semiconductor layers 120a and 120b may be formed by patterning the stacked epitaxial layers 120. During patterning of the epitaxial layers 120, the connection parts 115 may also be removed. By removing connection parts 115, first trenches 125 may be formed between the first and second semiconductor layers 120a and 120b. A photolithography and an etching technique may be used to pattern the epitaxial layers 120.

Accordingly, the first semiconductor layers 120a and the second semiconductor layers 120b may be respectively stacked with respective first and second interlayer insulation layers 110a and 110b alternatively interposed therebetween. The first semiconductor layers 120a and the second semiconductor layers 120b may be disposed with the first trenches 125 therebetween.

Figure 8:
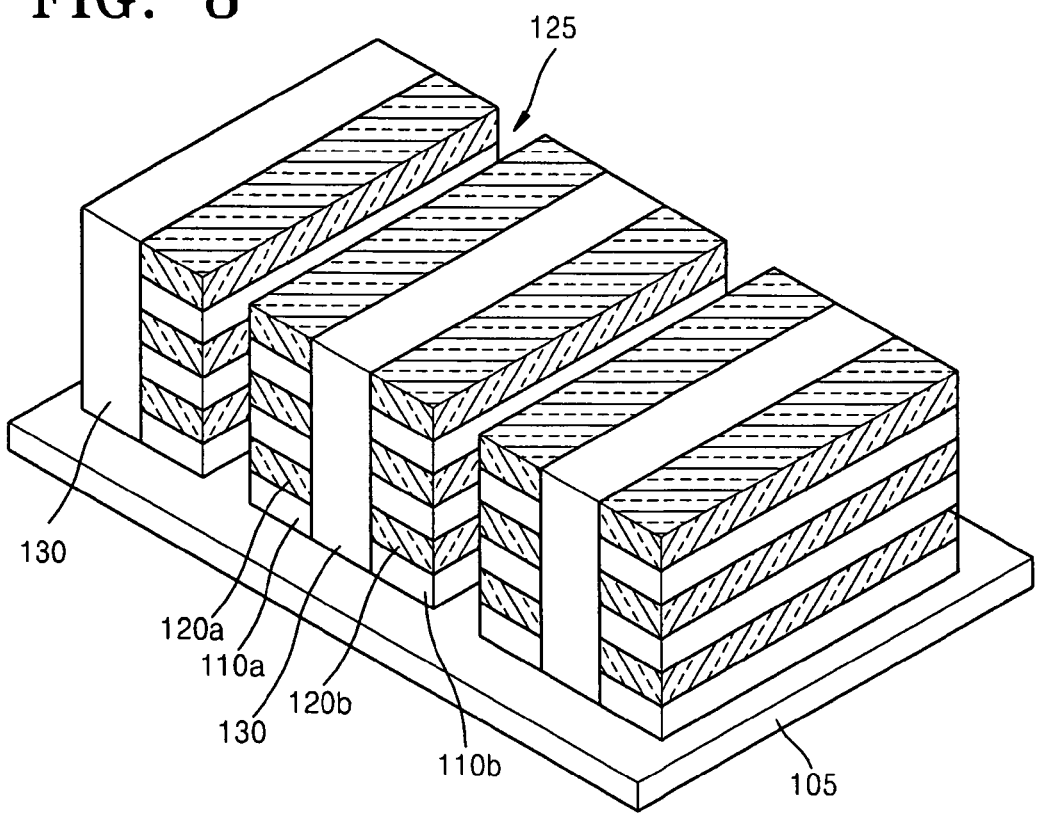

Referring to FIG. 8, a plurality of burying insulation layers 130 may be formed in the first trenches 125 between the first semiconductor layers 120a and the second semiconductor layers 120b. More particularly, the burying insulation layers 130 may be formed in one, some, or all of the first trenches 125b. Thus, the first trenches 125 may still remain between the first semiconductor layers 120a and the second semiconductor layers 120b, in which the burying insulation layers 130 are not formed.

Figure 9:
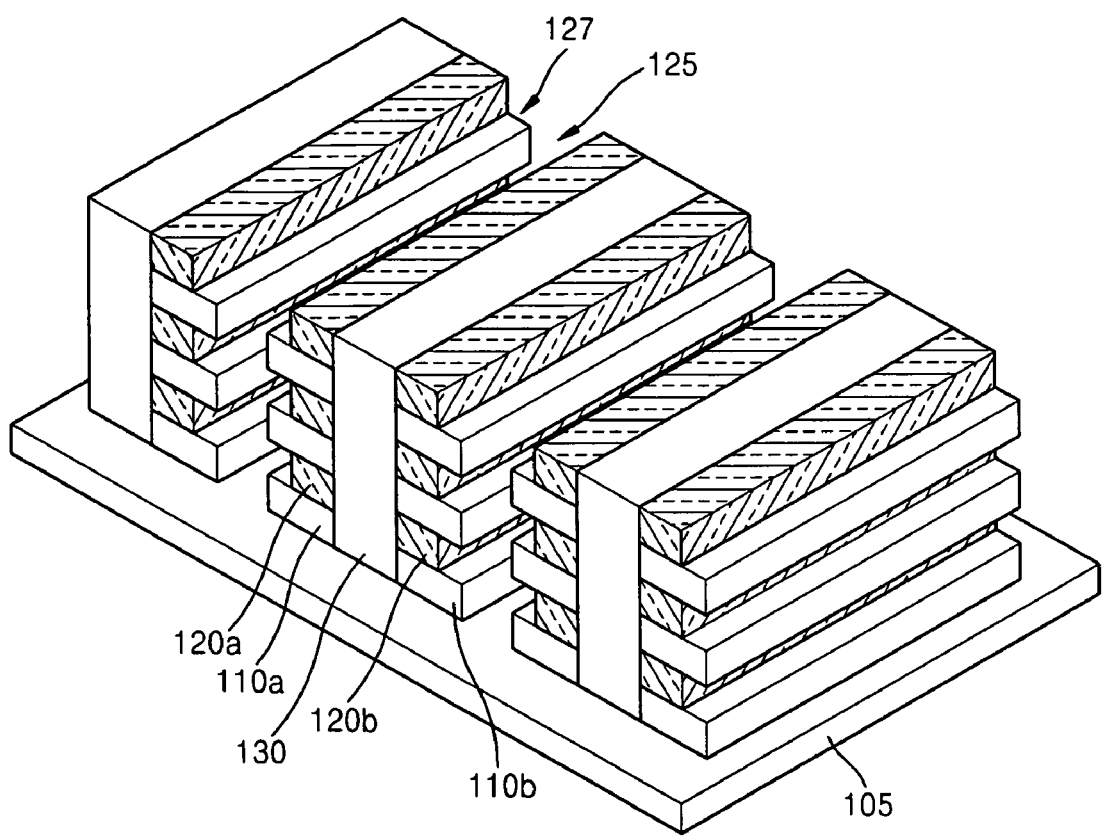

Referring to FIG. 9, portions of the first semiconductor layers 120a and the second semiconductor layers 120b exposed by the first trenches 125 may be selectively removed. Therefore, sidewalls of the first semiconductor layers 120a and the second semiconductor layers 120b opposite to the burying insulation layers 130 may be recessed compared to sidewalls of the interlayer insulation layers 110 exposed by the first trenches 125. For example, a width along the x-direction of the first and second semiconductor layers 120a and 120b may be narrower than a width of the respective first and second interlayer insulation layers 110a and 110b along the x-direction. A plurality of grooves 127 may be formed between the recessed portions of the first semiconductor layers 120a and the second semiconductor layers 120b and the respective first and second interlayer insulation layers 110a and 110b. The grooves 127 may be connected to the corresponding one of first trenches 125. For example, the grooves 127 may extend into the first trenches 125.

Portions of the first semiconductor layers 120a and the second semiconductor layers 120b may be removed by using, e.g., isotropic etching. The isotropic etching may use, e.g., wet etching or chemical dry etching.

Figure 10:
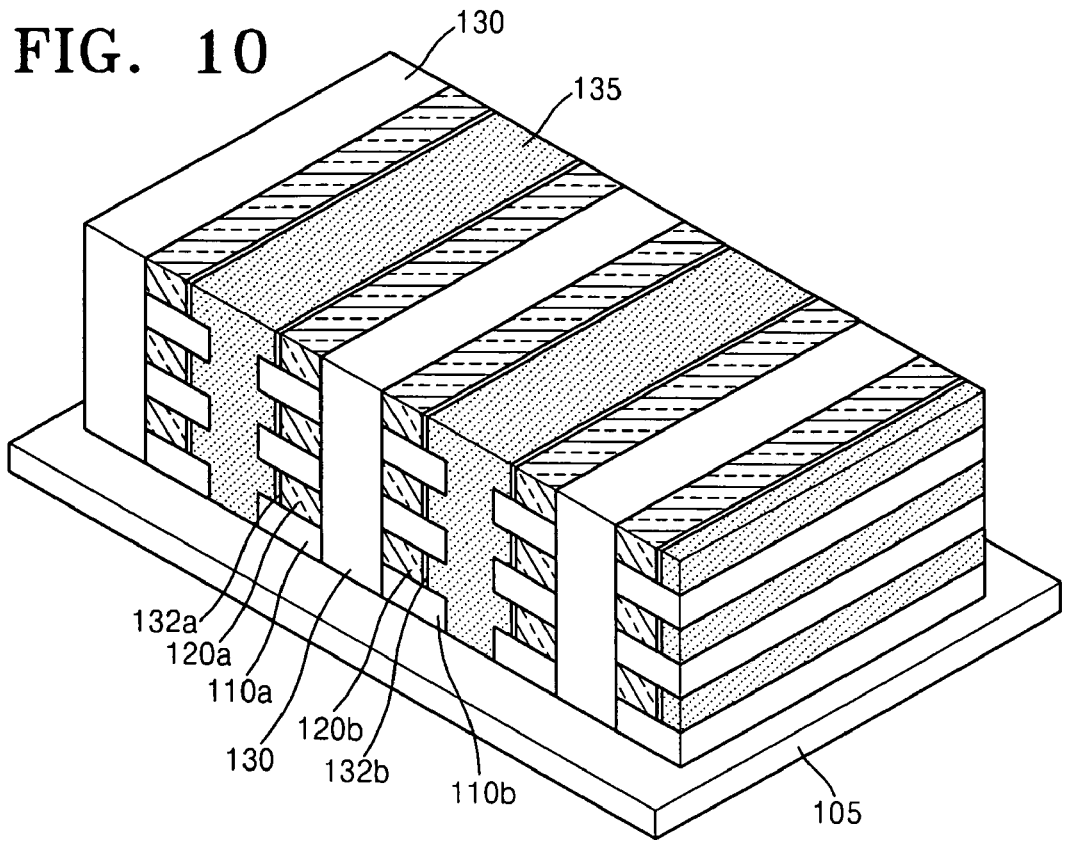

Referring to FIG. 10, the first dielectric layers 132a may be formed on the recessed sidewalls of the first semiconductor layers 120a. The second dielectric layers 132b may be formed on the recessed sidewalls of the second semiconductor layers 120b. The first dielectric layers 132a and the second dielectric layers 132b may not be formed on the sidewalls of the first and second interlayer insulation layers 110a and 110b. For example, the first dielectric layers 132a and the second dielectric layers 132b may be formed by selectively oxidizing the exposed surfaces of the first semiconductor layers 120a and the second semiconductor layers 120b. For another example, the first dielectric layers 132a and the second dielectric layers 132b may be formed in the form of spacers by depositing insulation layers, and then etching the deposited insulation layers.

Thereafter, conductive layer 135 may be formed to bury, e.g., fill, the grooves 127 and the first trenches 125. The conductive layer 135 may be planarized.

Figure 11:
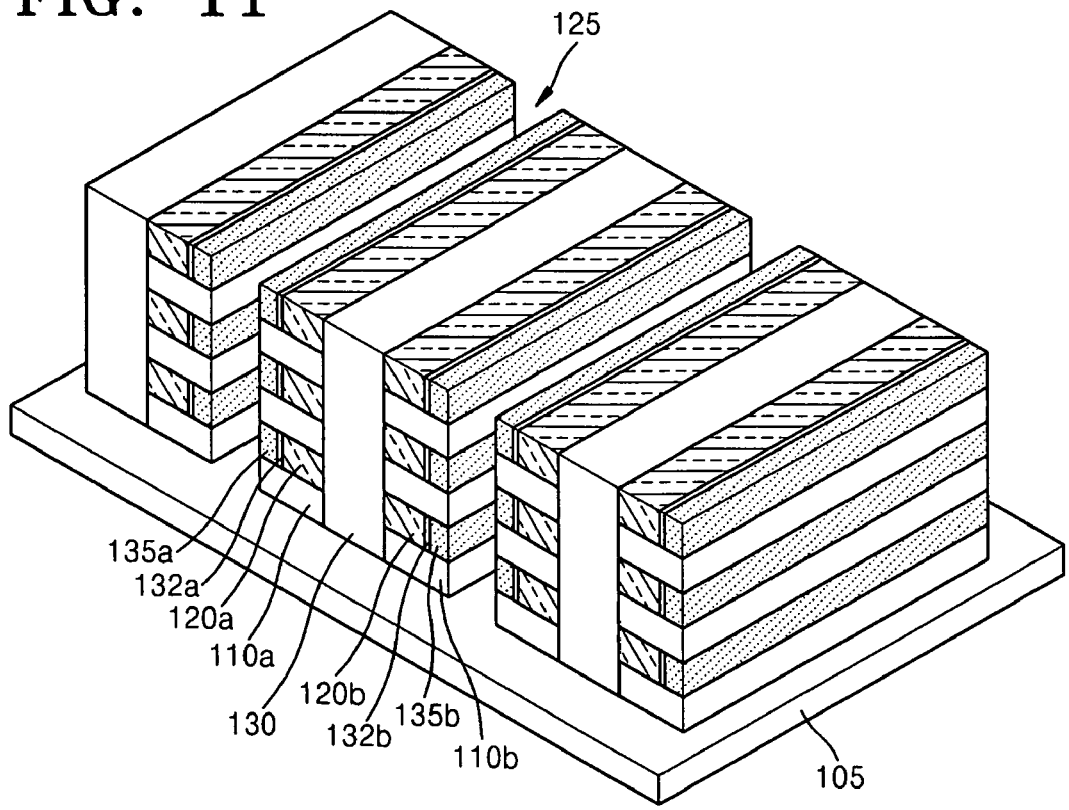

Referring to FIG. 11, the first layer selection lines 135a and the second layer selection lines 135b may be formed by patterning the conductive layer 135. More particularly, e.g., the conductive layer 135 may be patterned to remove portions thereof form the first trenches 125 and to maintain portions thereof in the grooves 127. The portions of the conductive layer 135 remaining in the grooves 127 may respectively correspond to the first layer selection lines 135a and the second layer selection lines 135b. The first layer selection lines 135a may be formed on the sidewalls of the first dielectric layers 132a on the sidewalls of the first semiconductor layers 120a opposite to the burying insulation layers 130. Each of the first layer selection lines 135a may be separated from each other by the respective first interlayer insulation layers 110a. The second layer selection lines 135b may be formed on the sidewalls of the second dielectric layers 132b on the sidewalls of the second semiconductor layers 120b opposite to the burying insulation layers 130. Each of the second layer selection lines 135b may be separated from each other by the respective second interlayer insulation layers 110b. The first and second layer selection lines 135a and 135b may be formed on sides of the respective first and second semiconductor layers 120a and 120b facing toward the first trenches 125, and not sides thereof facing toward the burying insulation layers 130.

For example, the first and second layer selection lines 135a and 135b may be formed in the grooves 127 as illustrated in FIG. 10. The first trenches 125 may remain between the first and second layer selection lines 135a and 135b.

Figure 12:
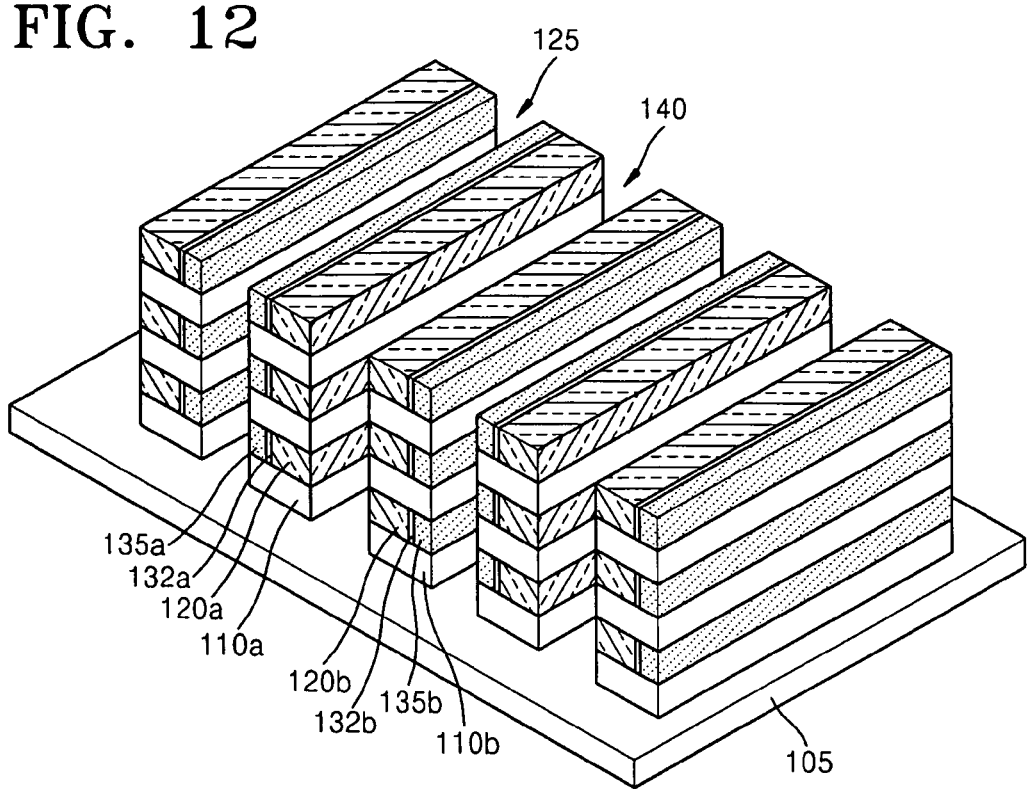

Referring to FIG. 12, a plurality of second trenches 140 may be formed in between the first and second semiconductor layers 120a and 120b by removing the burying insulation layers 130. For example, the burying insulation layers 130 may be removed using photolithography and etching.

Figure 13:
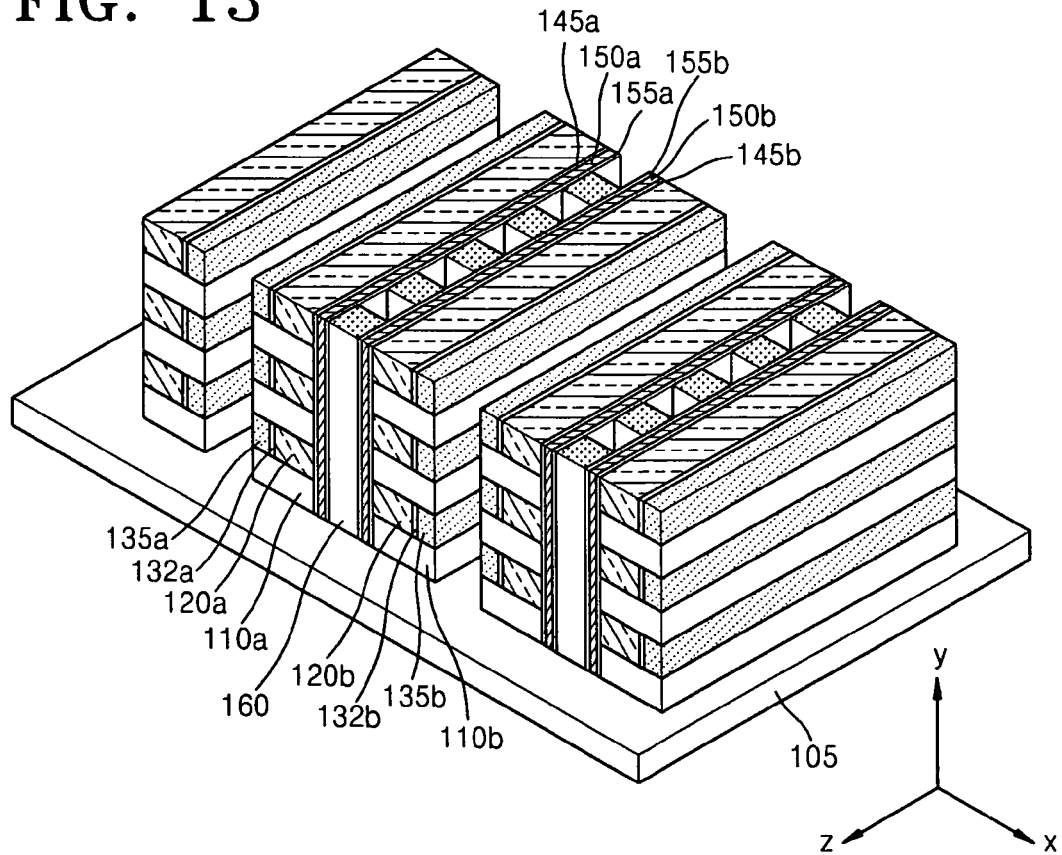

Referring to FIG. 13, the first and second tunneling insulation layers 145a and 145b may be formed on the sidewalls of the first and second semiconductor layers 120a and 120b within the second trenches 140. Thereafter, the first and second charge storage layers 150a and 150b may be formed on the first and second tunneling insulation layers 145a and 145b within the second trenches 140. Thereafter, the first and second blocking insulation layers 155a and 155b may be formed on the first and second charge storage layers 150a and 150b within the second trenches 140. The first and second tunneling insulation layers 145a and 145b, the first and second charge storage layers 150a and 150b, and the first and second charge storage layers 150a and 150b may be formed to extend along with the first and second semiconductor layers 120a and 120b.

The control gate electrodes 160 may be interposed between the first and second blocking insulation layers 155a and 155b within the second trenches 140. The control gate electrodes 160 may extend across the second trenches 140 along the x-direction, e.g., one end on the first blocking insulation layers 155a and the other end on the second blocking insulation layers 155b. The control gate electrodes 160 may be spaced apart from adjacent ones of the control gate electrodes 160 by a predetermined distance. The first and second layer selection lines 135a and 135b may be disposed on the sidewalls of the first and second semiconductor layers 120a and 120b opposite to the control gate electrodes 160.

For example, the control gate electrodes 160 may be formed by forming a conductive layer (not shown) to bury the second trenches 140 adjacent to the first and second blocking insulation layers 155a and 155b, and patterning the conductive layer. In some embodiments, e.g., the first and second tunneling insulation layers 145a and 145b, the first and second charge storage layers 150a and 150b, and the first and second blocking insulation layers 155a and 155b may be further patterned so that they may be aligned with the control gate electrodes 160, e.g., each corresponding to a respective one of the control gate electrodes 160.

In the exemplary method of manufacturing the non-volatile memory device illustrated in FIGS. 4-13, the control gate electrodes 160 may be formed after the first and second layer selection lines 135a and 135b are formed. Embodiments are not, however, limited thereto.

Figure 14:
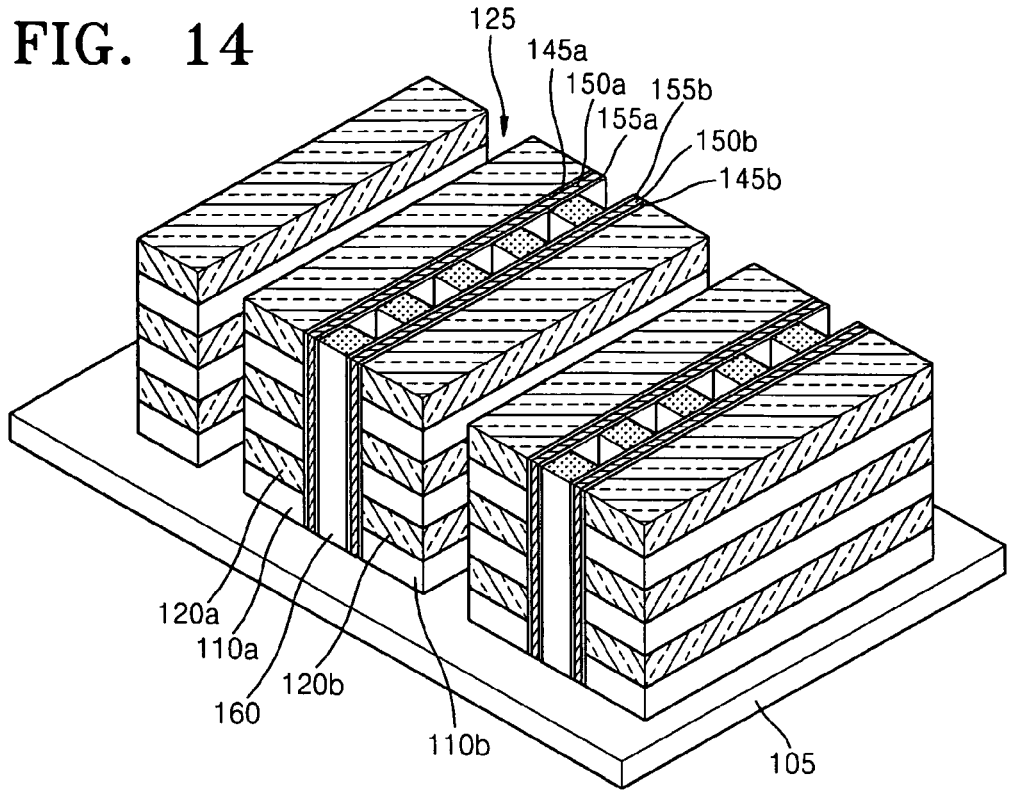
FIGS. 14 through 17 illustrate perspective views of stages in a method of manufacturing a non-volatile memory device according to another embodiment.

FIGS. 14 through 17 illustrate perspective views of stages in a method of manufacturing a non-volatile memory device according to another embodiment. The method of the present embodiment is a modification of the method illustrated in FIGS. 4 through 13, and thus, the redundant description thereof will not be repeated here. FIG. 14 illustrates a stage that may be after the stage illustrated in FIG. 7.

Referring to FIG. 14, the first and second tunneling insulation layers 145a and 145b may be formed on the sidewalls of the first and second semiconductor layers 120a and 120b within the first trenches 125. Thereafter, the first and second charge storage layers 150a and 150b may be formed on sidewalls of the first and second tunneling insulation layers 145a and 145b within the first trenches 125. The first and second blocking insulation layers 155a and 155b may be formed on the sidewalls of the first and second charge storage layers 150a and 150b within the first trenches 125.

The control gate electrodes 160 may be formed between the first and second blocking insulation layers 155a and 155b within the first trenches 125. The control gate electrodes 160 may extend across a space between the first and second blocking insulation layers 155a and 155b along the x-direction, with one end on the first blocking insulation layers 155a and the other end on the second blocking insulation layers 155b.

Figure 15:
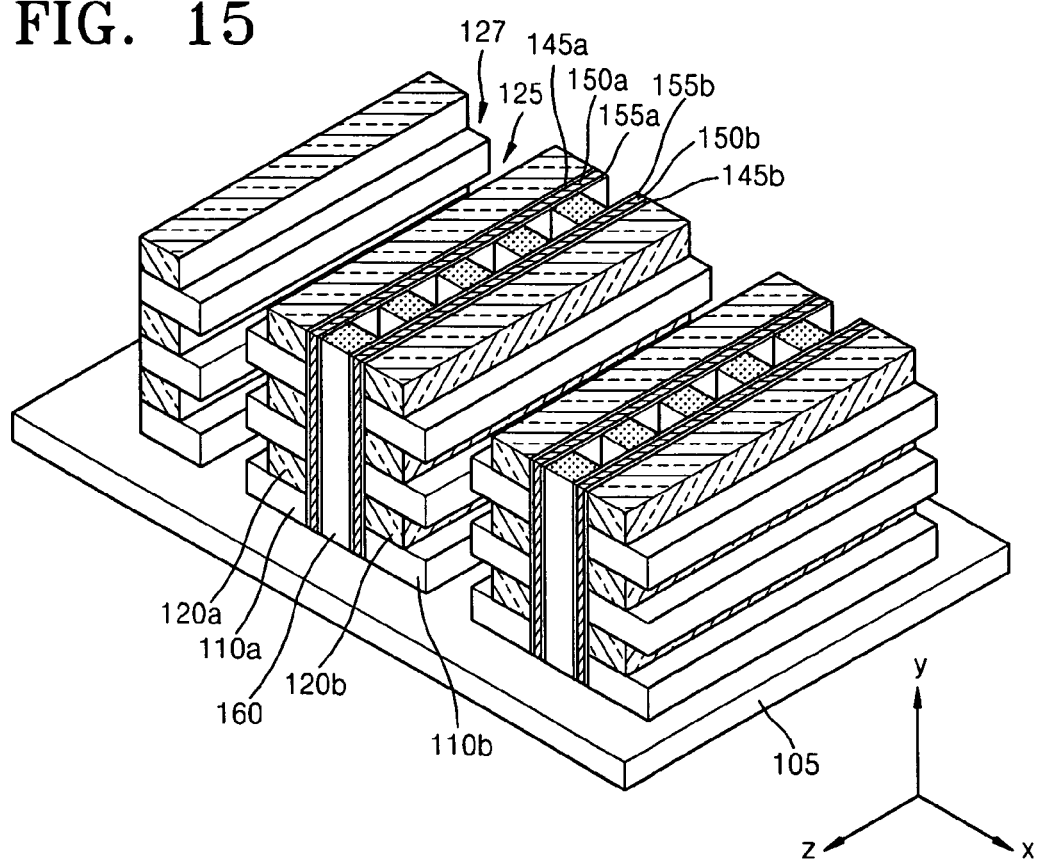

Referring to FIG. 15, the grooves 127 may be formed by recessing the sidewalls of the first and second semiconductor layers 120a and 120b opposite to the control gate electrodes 160. The operation of recessing the sidewalls of the first and second semiconductor layers 120a and 120b have already been described with respect to FIG. 9, and thus, will not be repeated here.

Figure 16:
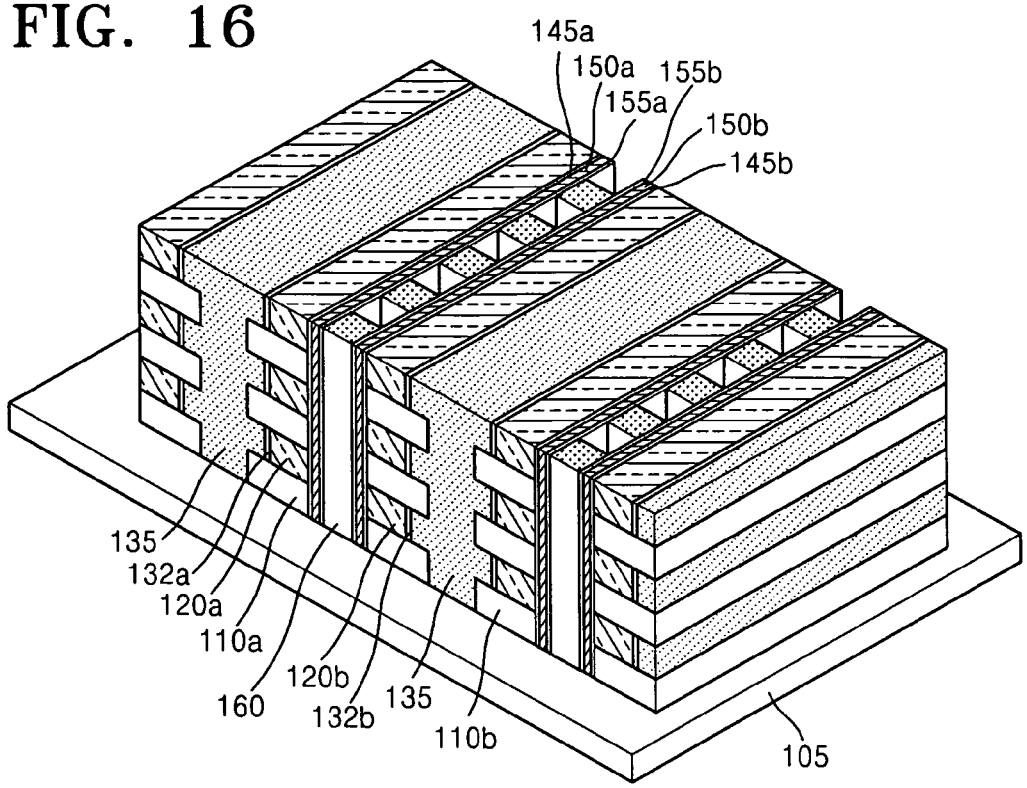

Referring to FIG. 16, the first and second dielectric layers 132a and 132b may be formed on the sidewalls of the first and second semiconductor layers 120a and 120b opposite to the control gate electrodes 160. Thereafter, the conductive layers 135 may be formed in the grooves 127 and the first trenches 125.

Figure 17:
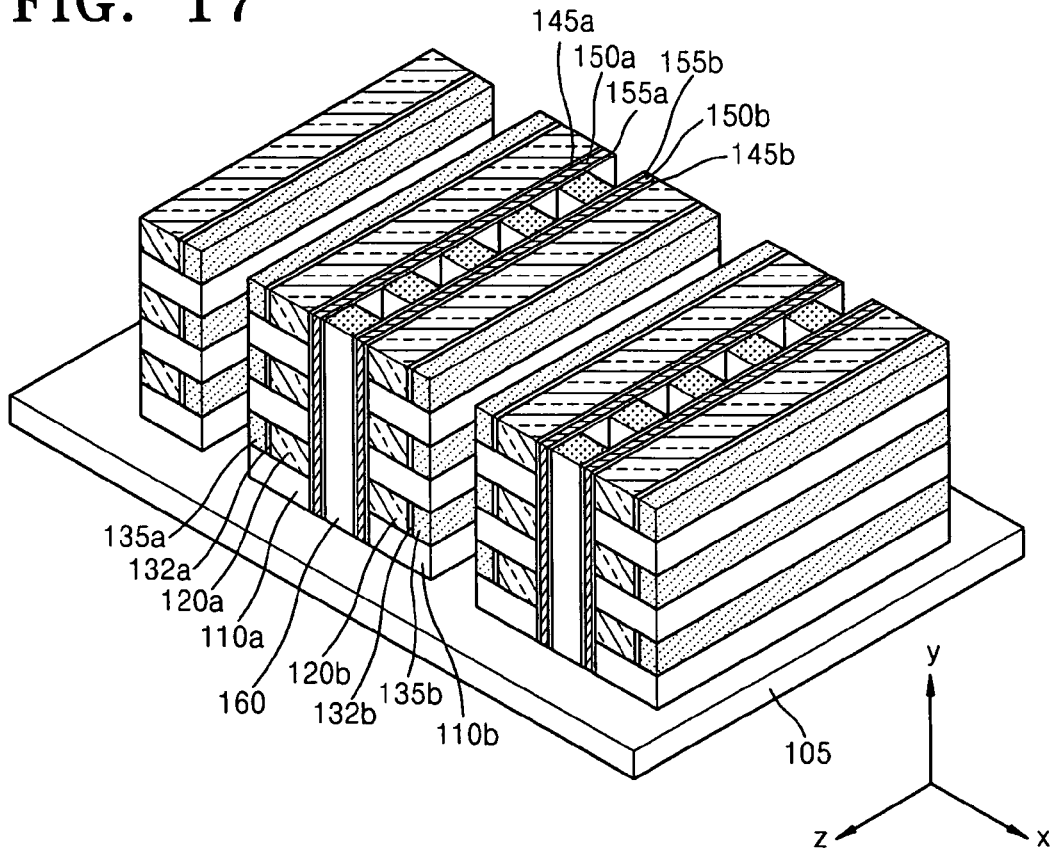

Referring to FIG. 17, the first layer selection lines 135a and the second layer selection lines 135b may be formed by patterning the conductive layers 135.

According to the exemplary method of manufacturing the non-volatile memory device illustrated in FIGS. 4-7 and 14-17, the first and second layer selection lines 135a and 135b may be formed after the control gate electrodes 160 are formed.

It should be understood that, e.g., the above described exemplary methods may be employed to provide the exemplary non-volatile memory device 10' of FIG. 2. More particularly, e.g., methods may include patterning the first and second tunneling insulation layers 145a, 145b, the first and second charge storage layers 150a, 155b, and the first and second blocking insulation layers 155a, 155b illustrated in, e.g., FIG. 13 so as to result in the first and second tunneling insulation layers 145a', 145b', the first and second charge storage layers 150a', 155b', and the first and second blocking insulation layers 155a', 155b' as shown in FIG. 2.

The methods of manufacturing the non-volatile memory device may be economical at least because the memory cells having a stacked structure may be simultaneously formed.

Figure 18:
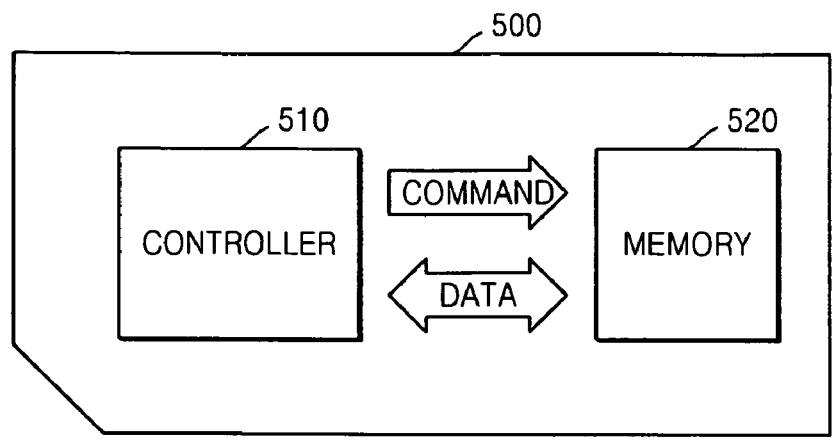
FIG. 18 illustrates a schematic block diagram of a memory card according to an embodiment.

FIG. 18 illustrates a schematic block diagram of a memory card 500 according to an embodiment.

Referring to FIG. 18, a controller 510 and a memory 520 may exchange an electrical signal. For example, the controller 510 and the memory 520 may communicate data in response to a command of the controller 510. Therefore, the memory card 500 may store the data in the memory 520 or output the data to the outside of the memory 520. The structure of the memory 520 may be any one of structures of the non-volatile memory devices illustrated in FIGS. 1 through 3.

The memory card 500 may be used as a data storage medium of various types of portable devices. For example, the memory card 500 may include a multimedia card (MMC) or a secure digital card (SD).

Figure 19:
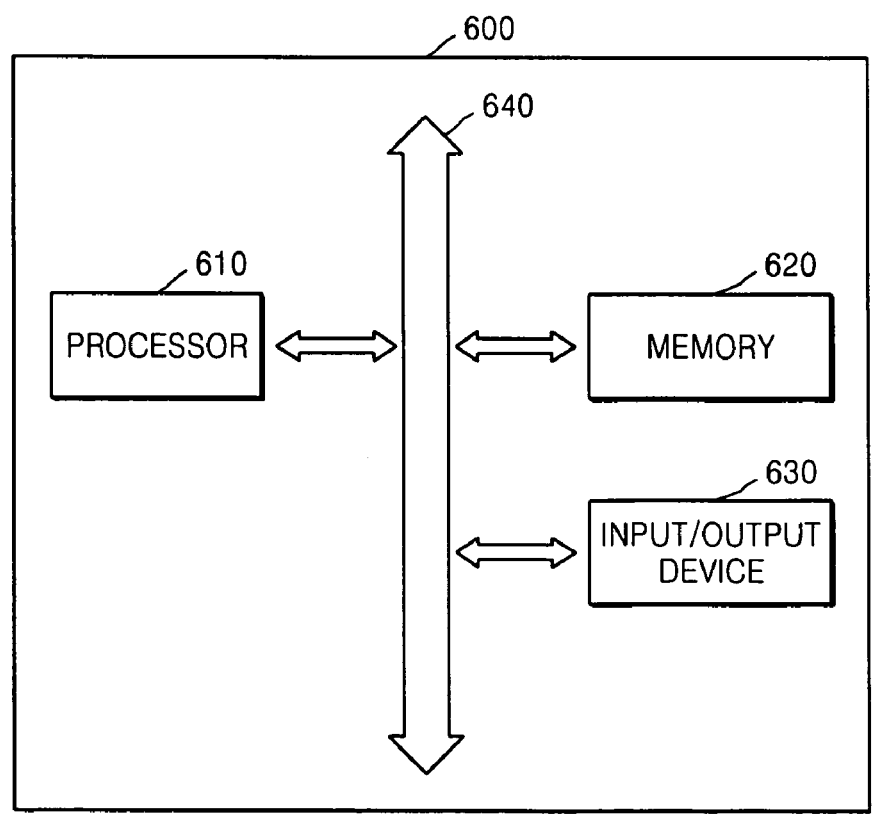
FIG. 19 illustrates a schematic block diagram of an electronic system according to an embodiment.

FIG. 19 illustrates a schematic block diagram of an electronic system 600 according to an embodiment.

Referring to FIG. 19, a processor 610, an input/output device 630, and a memory 620 may communicate data via a bus 640. The processor 610 may execute a program and may control the electronic system 600. The input/output device 630 may be used to input or output data of the electronic system 600. The electronic system 600 may be connected to an external device, e.g., a PC or a network, via the input/output device 630 and communicate data with the external device.

The memory 620 may store codes and data used to operate the processor 610. For example, the structure of the memory 620 may be the same as any one of structures of the non-volatile memory devices illustrated in FIGS. 1 through 3.

For example, the electronic system 600 may constitute various types of electronic control devices requiring the memory 620, and may be used in, e.g., a mobile phone, an MP3 player, a global positioning system (GPS), a solid state disk (SSD), or a household appliance.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a non-volatile memory device, the method comprising:
   forming at least one first semiconductor layer in a stack;
   forming at least one second semiconductor layer in a stack;
   forming at least one first layer selection line capacitively coupled to the at least one first semiconductor layer;
   forming at least one second layer selection line capacitively coupled to the at least one second semiconductor layer;
   forming at least one control gate electrode between the at least one first semiconductor layer and the at least one second semiconductor layer,
   wherein forming the at least one first semiconductor layer and the at least one second semiconductor layer includes:
      forming a plurality of interlayer insulation layers on a substrate;
      forming an epitaxial layer to cover the plurality of interlayer insulation layers; and
      patterning the epitaxial layer.

2. The method as claimed in claim 1, wherein the forming of the at least one first semiconductor layer and the at least one second semiconductor layer includes:
   forming another plurality of interlayer insulation layers and another epitaxial layer at least one more time before patterning the epitaxial layers.

3. The method as claimed in claim 2, wherein each of the epitaxial layers is formed using an epitaxial lateral overgrowth (ELO) method.

4. The method as claimed in claim 2, wherein the patterning of the epitaxial layers includes removing a plurality of connection parts formed between the plurality of interlayer insulation layers.

5. The method as claimed in claim 1, further comprising:
   recessing sidewalls of one side of the at least one first semiconductor layer and the at least one second semiconductor layer before forming the at least one first layer selection line and the at least one second layer selection line;
   wherein the at least one first layer selection line is formed on the recessed sidewalls of the at least one first semiconductor layer, and
   wherein the at least one second layer selection line is formed on the recessed sidewalls of the at least one second semiconductor layer.

6. The method as claimed in claim 5, further comprising:
   forming at least one first dielectric layer on the recessed sidewalls of the at least one first semiconductor layer; and
   forming at least one second dielectric layer on the recessed sidewalls of the at least one second semiconductor layer before forming the at least one first layer selection line and the at least one second layer selection line.

7. The method as claimed in claim 1, wherein the at least one control gate electrode is formed between sidewalls of the at least one first semiconductor layer opposite to the at least one first layer selection line and sidewalls of the at least one second semiconductor layer opposite to the at least one second layer selection line.

8. The method as claimed in claim 1, wherein the at least one control gate electrode is formed after the at least one first layer selection line and the at least one second layer selection line are formed.

9. The method as claimed in claim 1, wherein the at least one first layer selection line and the at least one second layer selection line are formed after the at least one control gate electrode is formed.

10. The method as claimed in claim 1, further comprising:
    forming at least one first charge storage layer between the at least one first semiconductor layer and the at least one control gate electrode; and
    forming at least one second charge storage layer between the at least one second semiconductor layer and the at least one control gate electrode.

11. The method as claimed in claim 10, further comprising:
    forming at least one first tunneling storage layer between the at least one first semiconductor layer and the at least one first charge storage layer;
    forming at least one second tunneling storage layer between the at least one second semiconductor layer and the at least one second charge storage layer;
    forming at least one first blocking insulation layer between the at least one first charge storage layer and the at least one control gate electrode; and
    forming at least one second blocking insulation layer between the at least one second charge storage layer and the at least one control gate electrode.

12. A method of manufacturing a non-volatile memory device, the method comprising:
    forming at least one first semiconductor layer in a stack;
    forming at least one second semiconductor layer in a stack;
    forming at least one first layer selection line capacitively coupled to the at least one first semiconductor layer;
    forming at least one second layer selection line capacitively coupled to the at least one second semiconductor layer;
    forming at least one control gate electrode between the at least one first semiconductor layer and the at least one second semiconductor layer;
    recessing sidewalls of one side of the at least one first semiconductor layer and the at least one second semiconductor layer before forming the at least one first layer selection line and the at least one second layer selection line;
    wherein the at least one first layer selection line is formed on the recessed sidewalls of the at least one first semiconductor layer, and
    wherein the at least one second layer selection line is formed on the recessed sidewalls of the at least one second semiconductor layer.

13. A method of manufacturing a non-volatile memory device, the method comprising:
    forming at least one first semiconductor layer in a stack;
    forming at least one second semiconductor layer in a stack;
    forming at least one first layer selection line capacitively coupled to the at least one first semiconductor layer;
    forming at least one second layer selection line capacitively coupled to the at least one second semiconductor layer; and
    forming at least one control gate electrode between the at least one first semiconductor layer and the at least one second semiconductor layer, wherein the at least one control gate electrode is formed after the at least one first layer selection line and the at least one second layer selection line are formed.

14. A method of manufacturing a non-volatile memory device, the method comprising:

forming at least one first semiconductor layer in a stack;

forming at least one second semiconductor layer in a stack;

forming at least one first layer selection line capacitively coupled to the at least one first semiconductor layer;

forming at least one second layer selection line capacitively coupled to the at least one second semiconductor layer;

forming at least one control gate electrode between the at least one first semiconductor layer and the at least one second semiconductor layer;

forming at least one first charge storage layer between the at least one first semiconductor layer and the at least one control gate electrode; and forming at least one second charge storage layer between the at least one second semiconductor layer and the at least one control gate electrode.

* * * * *